US011079796B2

(12) United States Patent
Choe et al.

(10) Patent No.: US 11,079,796 B2
(45) Date of Patent: Aug. 3, 2021

(54) ELECTRONIC DEVICE INCLUDING FLEXIBLE PRINTED CIRCUIT BOARD ADJACENT TO ANTENNA

(71) Applicant: Samsung Electronics Co., Ltd., Gyeonggi-do (KR)

(72) Inventors: Jaewon Choe, Gyeonggi-do (KR); Kyungmoon Seol, Gyeonggi-do (KR); Jaemoon Lee, Gyeonggi-do (KR); Jungkyu Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 224 days.

(21) Appl. No.: 16/441,861

(22) Filed: Jun. 14, 2019

(65) Prior Publication Data
US 2019/0384358 A1   Dec. 19, 2019

(30) Foreign Application Priority Data
Jun. 15, 2018   (KR) .................. 10-2018-0068563

(51) Int. Cl.
*H01Q 1/24*   (2006.01)
*G06F 1/16*   (2006.01)
(Continued)

(52) U.S. Cl.
CPC .......... *G06F 1/1626* (2013.01); *G06F 1/1698* (2013.01); *H01Q 1/243* (2013.01);
(Continued)

(58) Field of Classification Search
CPC ................. H05K 1/181; H05K 1/165; H05K 2201/10037; H05K 2201/1003;
(Continued)

(56) References Cited

U.S. PATENT DOCUMENTS 9,502,750 B2   11/2016   Yarga et al.
9,531,061 B2   12/2016   Han et al.
(Continued)

FOREIGN PATENT DOCUMENTS

| KR | 1020100034213 | 4/2010 |
| KR | 1020160022074 | 2/2016 |
| KR | 1020170037464 | 4/2017 |

OTHER PUBLICATIONS

International Search Report dated Oct. 16, 2019 issued in counterpart application No. PCT/KR2019/007226, 11 pages.

*Primary Examiner* — Savitri Mulpuri
(74) *Attorney, Agent, or Firm* — The Farrell Law Firm, P.C.

(57) ABSTRACT

An electronic device includes a cover glass, a back cover, a side member that surrounds a space between the cover glass and the back cover, wherein at least a portion of the side member is formed of a conductive member, a support member that is extended from the side member and includes at least one opening, a first printed circuit board that is interposed between the support member and the back cover or between the support member and the cover glass, a second printed circuit board that is interposed between the first printed circuit board and the back cover or between the first printed circuit board and the cover glass, an electrical component that is positioned on the first printed circuit board, and a wireless communication circuit that is positioned on the second printed circuit board.

20 Claims, 9 Drawing Sheets

(51) Int. Cl.
  *H05K 1/02* (2006.01)
  *H04M 1/02* (2006.01)
(52) U.S. Cl.
  CPC ............ *H01Q 1/244* (2013.01); *H01Q 1/245* (2013.01); *H04M 1/026* (2013.01); *H04M 1/0266* (2013.01); *H04M 1/0268* (2013.01); *H05K 1/0298* (2013.01)
(58) Field of Classification Search
  CPC .... H05K 3/429; H05K 1/0203; H05K 1/0298; H05K 2201/10151; H05K 1/118; H05K 2201/10098; H05K 2201/052; H05K 1/147; H04B 5/0081; H04B 5/0037; H04B 5/0031; H01F 38/14; H02J 50/90; H02J 50/12; H02J 7/00034; H04M 1/0262; H04M 2250/12; H04M 1/0277; H04M 1/026; G01K 13/00; G06F 1/1698; G06F 1/1656; G06F 1/1626; H01Q 1/44; H01Q 9/42; H01Q 1/243; H01Q 21/30; H01Q 1/38; H01Q 21/08; H01Q 21/06; H01Q 9/0407; H01Q 1/526; H01Q 9/16
  See application file for complete search history.

(56) References Cited

U.S. PATENT DOCUMENTS

| | | | |
|---|---|---|---|
| 10,116,039 | B2 | 10/2018 | Lee et al. |
| 10,171,125 | B2 | 1/2019 | Mow et al. |
| 2012/0009983 | A1 | 1/2012 | Mow et al. |
| 2014/0292587 | A1 | 10/2014 | Yarga et al. |
| 2015/0280771 | A1 | 10/2015 | Mow et al. |
| 2016/0064801 | A1 | 3/2016 | Han et al. |
| 2017/0047791 | A1* | 2/2017 | Jang .................. H01F 38/14 |
| 2017/0202085 | A1* | 7/2017 | Go .................. H05K 1/0296 |
| 2018/0287246 | A1 | 10/2018 | Kim et al. |
| 2018/0299929 | A1* | 10/2018 | Kim .................. G06F 1/1635 |
| 2019/0281146 | A1* | 9/2019 | Jang .................. H04M 1/026 |

* cited by examiner

ELECTRONIC DEVICE INCLUDING FLEXIBLE PRINTED CIRCUIT BOARD ADJACENT TO ANTENNA

CROSS-REFERENCE TO RELATED APPLICATION(S)

This application is based on and claims priority under 35 U.S.C. § 119 to Korean Patent Application No. 10-2018-0068563, filed on Jun. 15, 2018, in the Korean Intellectual Property Office, the entire disclosure of which is incorporated herein by reference.

BACKGROUND

1. Field

The disclosure relates generally to a technology for improving performance of an antenna.

2. Description of Related Art

As various kinds of parts are mounted on an electronic device (e.g., a smartphone), a user may utilize many functions through the various kinds of parts. For example, the user may take a picture through a camera and may perform a financial payment function or a screen unlocking function through a biometric sensor (e.g., a fingerprint sensor or an iris sensor). Also, the user may transmit/receive various kinds of data (e.g., a message) through an antenna.

When the parts are mounted on the electronic device, a separation distance between the parts may be very short due to a narrow mounting space. As the separation distance between the various kinds of parts becomes shorter, the various kinds of parts may influence each other. For example, an antenna and a part adjacent to the antenna may be coupled, and the coupled part may reduce the performance of the antenna or may cause a parasitic resonance.

SUMMARY

The present disclosure has been made to address at least the disadvantages described above and to provide at least the advantages described below.

In accordance with an aspect of the disclosure, an electronic device is provided. The electronic device includes a cover glass, a back cover that faces away from the cover glass, a side member that surrounds a space between the cover glass and the back cover, where at least a portion of the side member is formed of a conductive member, a support member that is extended from the side member, is interposed between the cover glass and the back cover, and includes at least one opening, a first printed circuit board that is interposed between the support member and the back cover or between the support member and the cover glass, a second printed circuit board that is interposed between the first printed circuit board and the back cover or between the first printed circuit board and the cover glass, an electrical component that overlaps the opening when viewed from above the cover glass and is positioned on the first printed circuit board to be adjacent to the conductive member, and a wireless communication circuit that is positioned on the second printed circuit board, is electrically connected with the conductive member, and transmits or receive a signal in a specified frequency band. The first printed circuit board at least partially overlaps the support member when viewed from above the first printed circuit board. The first printed circuit board includes a conductive layer, a first portion having a first width, and a second portion connecting the electrical component and the first portion, the second portion having a second width smaller than the first width.

In accordance with an aspect of the disclosure, an electronic device is provided. The electronic device includes a cover glass, a back cover that faces away from the cover glass, a side member that surrounds a space between the cover glass and the back cover, an antenna element that includes at least a portion of the side member, a support member that is extended from the side member and is interposed between the cover glass and the back cover, a first printed circuit board that includes a first portion contacting the support member and a second portion not contacting the support member, a second printed circuit board that is interposed between the first printed circuit board and the back cover, a sensor that is positioned in the second portion, and a wireless communication circuit that is positioned on the second printed circuit board and is electrically connected with the antenna element. A width of the first portion is greater than or equal to a width of the second portion.

In accordance with an aspect of the disclosure, an electronic device is provided. The electronic device includes a housing that includes a first non-conductive plate, a second non-conductive plate facing away from the first non-conductive plate, and a side member surrounding a space between the first non-conductive plate and the second non-conductive plate, where the side member includes a first conductive portion, a second conductive portion, and a first insulating portion interposed between the first conductive portion and the second conductive portion, a conductive mid-plate that forms at least a portion of an opening together with the first conductive portion, the second conductive portion, and the first insulating portion when viewed from above the second non-conductive plate, and is extended from the second conductive portion of the side member within a space between the first non-conductive plate and the second non-conductive plate, a printed circuit board (PCB) that is positioned in the space and parallel to the second non-conductive plate, a wireless communication circuit that is positioned on the printed circuit board and is electrically connected with the first conductive portion, an electrical component that is positioned in the space and at least partially overlaps the opening, when viewed from above the second non-conductive plate, and a flexible PCB (FPCB) that includes a first portion overlapping the conductive mid-plate and a second portion overlapping the opening when viewed from the second non-conductive plate. The FPCB includes at least one conductive line electrically connected with the electrical component, and a conductive plate formed in a part of the first portion and a part of the second portion. A conductive plate in the part of the first portion is spaced from the conductive mid-plate, is parallel to the conductive mid-plate, and is electrically isolated from the conductive line.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
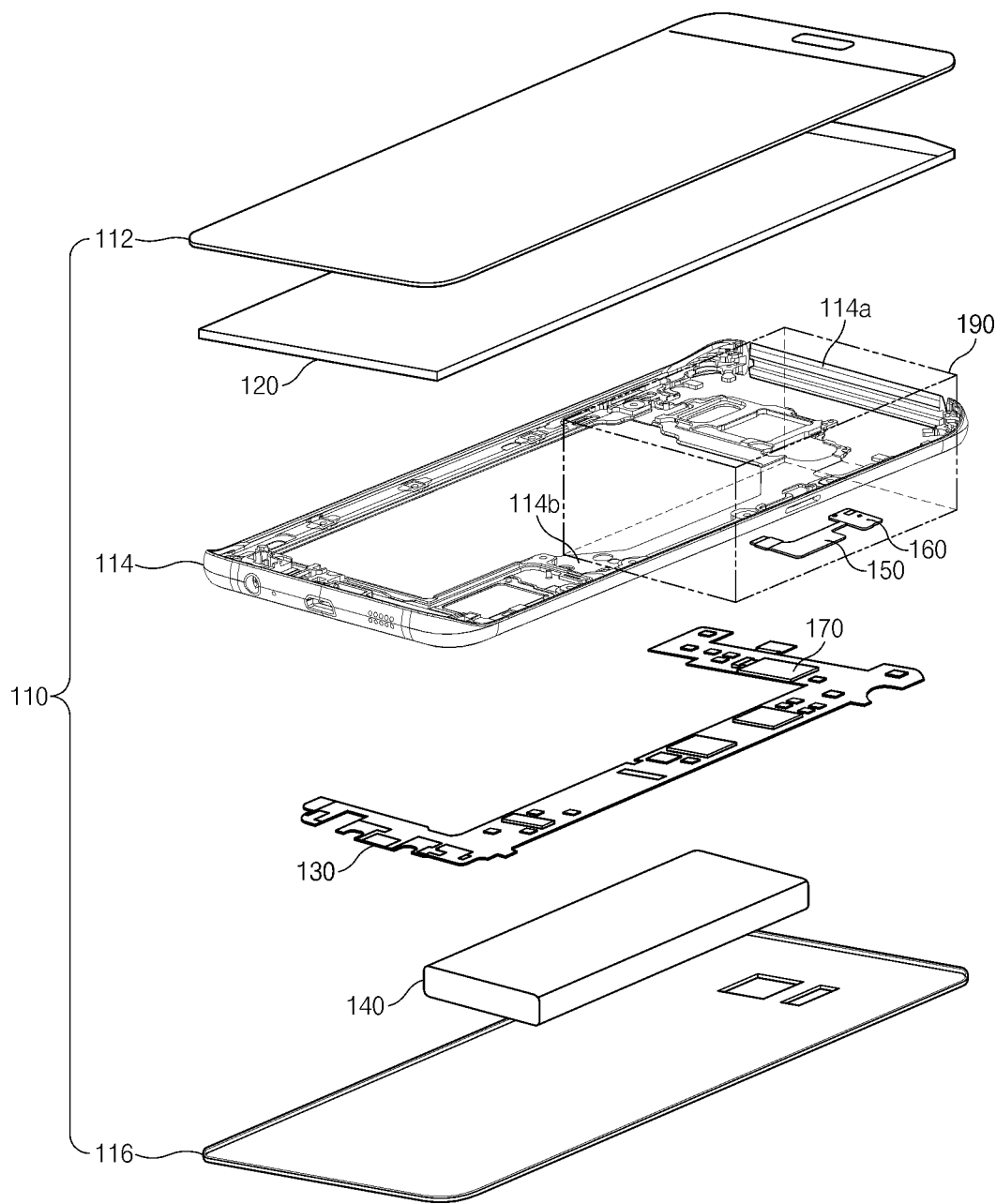
FIG. 1 is a diagram of an electronic device, according to an embodiment.

FIG. 1 is diagram of an electronic device, according to an embodiment.

Referring to FIG. 1, an electronic device 100 includes a housing 110, a display 120, a first printed circuit board (PCB) 150, a second PCB 130, a battery 140, and a wireless communication circuit 170. The electronic device 100 may not include some of the components illustrated in FIG. 1 or may further include one or more components not illustrated in FIG. 1. Also, the order in which the components included in the electronic device 100 are stacked may be different from the stacked order illustrated in FIG. 1.

The housing 110 may form the exterior of the electronic device 100. The housing 110 may include a cover glass 112, a back cover 116 facing away from cover glass 112, and a side member 114 surrounding a space between the cover glass 112 and the back cover 116.

The cover glass 112 may transmit a light generated by the display 120. The user may touch a portion (e.g., a finger) of his/her body on the cover glass 112 to perform a touch (including a contact using an electronic pen).

The side member 114 may protect the components included in the electronic device 100. The display 120 and the battery 140 may be accommodated within the side member 114, and the side member 114 may protect the components from an external shock.

At least a portion of the side member 114 may be used as an antenna element 114a. The electronic device 100 may transmit/receive a signal in a specified frequency band by supplying a power to (or feeding) an area of the side member 114, which is formed of a conductive material. The area formed of the conductive material may be referred to as the "antenna element 114a" or a "conductive member 114a".

A support member 114b may be positioned inside the side member 114. The support member 114b may be extended from the side member 114 to fix various kinds of parts (e.g., the display 120) positioned in the electronic device 100.

The back cover 116 may be connected to the side member 114. The back cover 116 may be formed of tempered glass, plastic, and/or metal. The back cover 116 may be integrally implemented with the side member 114 or may be implemented to be removable by the user.

The display 120 may be interposed between the cover glass 112 and the side member 114. The display 120 may output content (e.g., a text, an image, a video, an icon, a widget, or a symbol) or may receive a touch input (including a touch, a gesture, or a hovering) from the user.

The first PCB 150 may be interposed between the support member 114b and the second PCB 130. A portion of the first PCB 150 may be connected with the support member 114b.

The remaining portion of the first PCB 150 may be exposed through an opening defined in the support member 114b, when viewed from above the cover glass 112.

An electrical component 160 may be positioned on the first PCB 150. Although not illustrated in FIG. 1, the first PCB 150 may be electrically connected with the wireless communication circuit 170, and the wireless communication circuit 170 may control the electrical component 160 through the first PCB 150. The first PCB 150 may be referred to as a "flexible PCB (FPCB)". The electrical component 160 may be referred to as at least one of a proximity sensor, an illumination sensor, and a camera.

Various kinds of parts included in the electronic device 100 may be mounted on the second PCB 130. The wireless communication circuit 170 (or a processor) or a memory may be mounted on the second PCB 130. In the present disclosure, the second PCB 130 may be referred to as a "main board" or a "printed board assembly (PBA)".

The wireless communication circuit 170 may be electrically connected with the antenna element 114a and may supply a power to (or may feed) the antenna element 114a. When the wireless communication circuit 170 supplies a power to the antenna element 114a, the antenna element 114a and the first PCB 150 may be coupled, and the wireless communication circuit 170 may be indirectly connected with the first PCB 150 through the antenna element 114a. The wireless communication circuit 170 may be referred to as a "wireless communication circuit", a "communication module", and/or a communication processor (CP)". "Feed", "feeding", and "supplying of a power" may mean an operation in which the wireless communication circuit 170 applies a current to the antenna element 114a. The expression "indirect connection" may mean a state where a current flows to a part coupled with the antenna element 114a when the wireless communication circuit 170 supplies a power to the antenna element 114a.

An antenna 190 may include the antenna element 114a, at least a portion of the first PCB 150, and at least a portion of the support member 114b. When the wireless communication circuit 170 supplies a power to the antenna 190, the antenna 190 may transmit/receive a signal in a specified frequency band (e.g., ranging from about 950 MHz to about 1050 MHz), based on an electrical path formed through the antenna element 114a and the first PCB 150.

A width of the first PCB 150 may increase. As the width of the first PCB 150 increases, a contact area of the first PCB 150 and the support member 114b may increase, or a distance between the first PCB 150 and an area (e.g., a ground area of the display 120) capable of being used as a ground of the antenna 190 may decrease. As the contact area of the first PCB 150 and the support member 114b increases or the distance between the first PCB 150 and the area capable of being used as a ground of the antenna 190 decreases, a capacitance of the antenna 190 may increase, and a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the performance of radiation of the antenna 190 may be improved in a specified frequency band (e.g., ranging from about 950 MHz to about 1050 MHz).

The battery 140 may convert chemical energy and electrical energy bidirectionally. The battery 140 may convert chemical energy into electrical energy and may supply the converted electrical energy to the display 120 and various components or modules mounted on the second PCB 130.

Alternatively, the battery 140 may convert and store electrical energy supplied from the outside into chemical energy. A power management module for managing the charging and discharging of the battery 140 may be included in the second PCB 130.

The description given with reference to FIG. 1 may be identically applied to components having the same reference numerals/marks as the components of the electronic device 100 described with reference to FIG. 1.

Figure 2A:
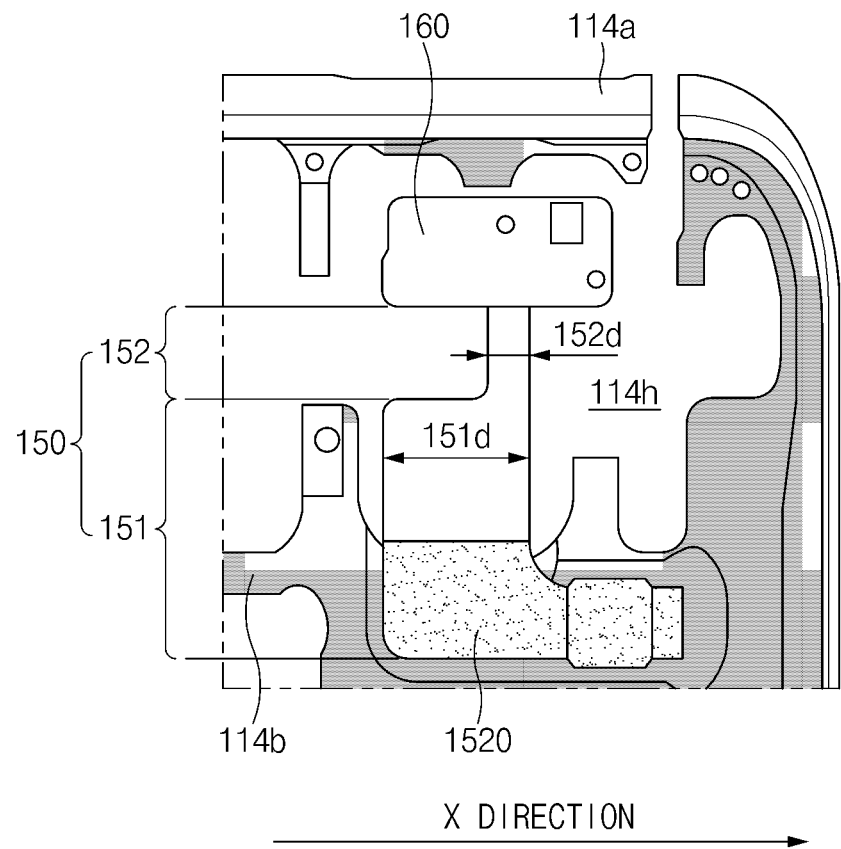
FIG. 2A is a diagram of a state where a first printed circuit board is attached to a support member, according to an embodiment.

FIG. 2A is a diagram of a state where a first PCB is attached to a support member, according to an embodiment. FIG. 2A illustrates the first PCB 150 when viewed from above the second PCB 130.

Referring to FIG. 2A, the first PCB 150 may include a first portion 151 and a second portion 152. The first PCB 150 may be a single component. However, below, a description will be given as the first PCB 150 includes the first portion 151 and the second portion 152, for convenience of description.

A portion 1520 of the first portion 151 may be attached to the support member 114b, and the remaining portion of the first portion 151 may not be attached to the support member 114b. The portion 1520, which is attached to the support member 114b, of the first portion 151 may be bent and extended in an x-direction. The remaining portion of the first portion 151 may overlap an opening 114h defined in the support member 114b, when viewed from above the cover glass 112.

The second portion 152 may connect the first portion 151 and the electrical component 160. A wire through which a signal for controlling the electrical component 160 is transferred may be placed in the second portion 152 and the first portion 151.

A width 151d of the first portion 151 may be different from a width 152d of the second portion 152. The width 151d of the first portion 151 may be greater than the width 152d of the second portion 152. A contact area of the support member 114b and the first portion 151 of the first PCB 150 may be wider than a contact area of the support member 114b and the second portion 152 of the first PCB 150.

The width 151d of the first portion 151 may increase. As the width 151d of the first portion 151 increases, the contact area of the support member 114b and the portion 1520 of the first portion 151 may increase. Also, the remaining portion of the first portion 151 may become closer to a ground area (e.g., a shield layer) of the display 120 through the opening 114h. As the contact area of the support member 114b and the portion 1520 of the first portion 151 increases or a distance between the remaining portion of the first portion 151 and the ground area of the display 120 decreases, the capacitance of the antenna 190 may increase. Also, as the contact area of the support member 114b and the portion 1520 of the first portion 151 increases or the distance between the remaining portion of the first portion 151 and the ground area of the display 120 decreases, a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the performance of radiation of the antenna 190 may be improved in the specified frequency band.

Figure 2B:
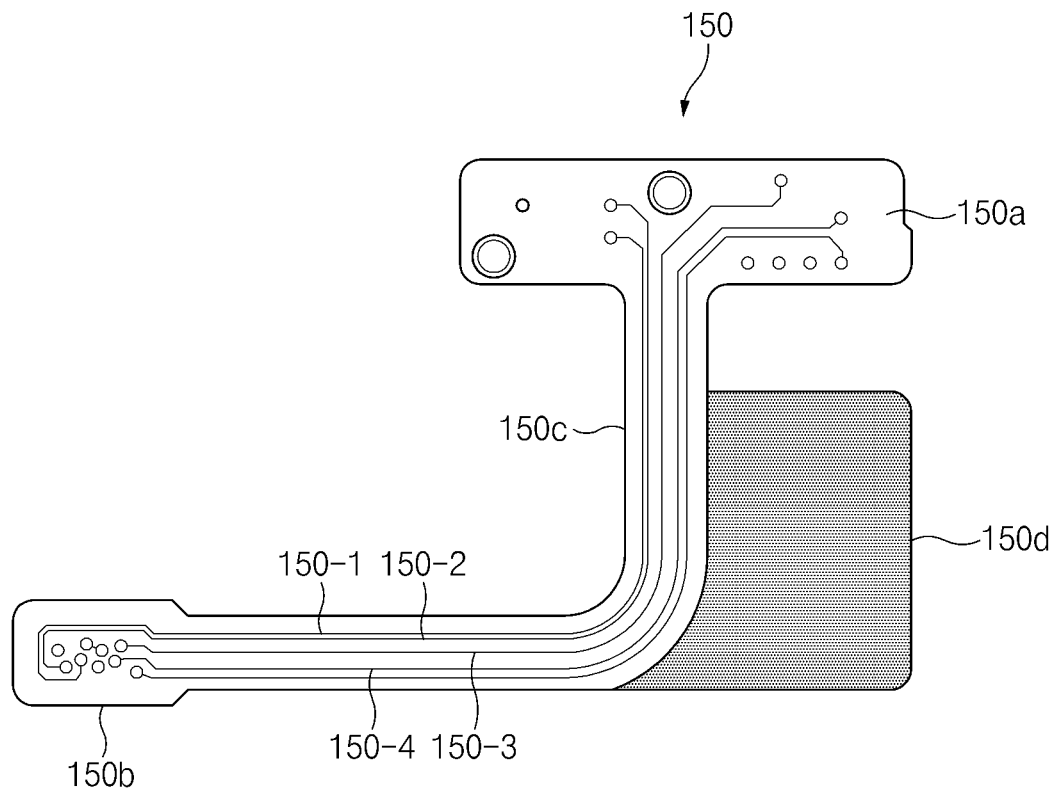
FIG. 2B is illustrating diagram of a first printed circuit board, according to an embodiment.

FIG. 2B is a diagram of a first PCB, according to an embodiment.

Referring to FIG. 2B, the first PCB 150 may include an electrical component mounting part 150a, a connection part 150b, a signal transfer part 150c, and a ground part 150d.

The first PCB 150 may be a single component. However, below, a description will be given as the first PCB 150 includes the electrical component mounting part 150a, the connection part 150b, the signal transfer part 150c, and the ground part 150d, for convenience of description.

The electrical component 160 may be connected to the electrical component mounting part 150a. The electrical component 160 that is connected to the electrical component mounting part 150a may at least partially overlap an opening 114h defined in the support member 114b.

The connection part 150b may be electrically connected with the support member 114b and the second PCB 130. The connection part 150b may be connected with the wireless communication circuit 170 through specified wires.

The signal transfer part 150c may electrically connect the electrical component mounting part 150a and the connection part 150b and may include a plurality of layers. At least one of wires 150-1, 150-2, 150-3, and 150-4 through which signals generated by the wireless communication circuit 170 are transferred may be placed in the signal transfer part 150c. The wireless communication circuit 170 may control the electrical component 160 through at least one of the wires 150-1, 150-2, 150-3, and 150-4. When the electrical component 160 is a camera, the wireless communication circuit 170 may allow the camera to photograph an external object through at least one of the wires 150-1, 150-2, 150-3, and 150-4. When the electrical component 160 is an infrared sensor, the wireless communication circuit 170 may allow the infrared sensor to emit a light in an infrared band through at least one of the wires 150-1, 150-2, 150-3, and 150-4.

The ground part 150d may be extended from one area of the signal transfer part 150c and may include a plurality of layers. At least one of the plurality of layers of the ground part 150d may correspond to a conductive layer. As the first PCB 150 includes the ground part 150d, a contact area of the first PCB 150 and the support member 114b may increase, or a distance between the first PCB 150 and a ground area of the display 120 may decrease. As the contact area of the first PCB 150 and the support member 114b increases or the distance between the first PCB 150 and the ground area of the display 120 decreases, a capacitance of the antenna 190 may increase, and a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the performance of radiation of the antenna 190 may be improved in the specified frequency band.

Figure 3:
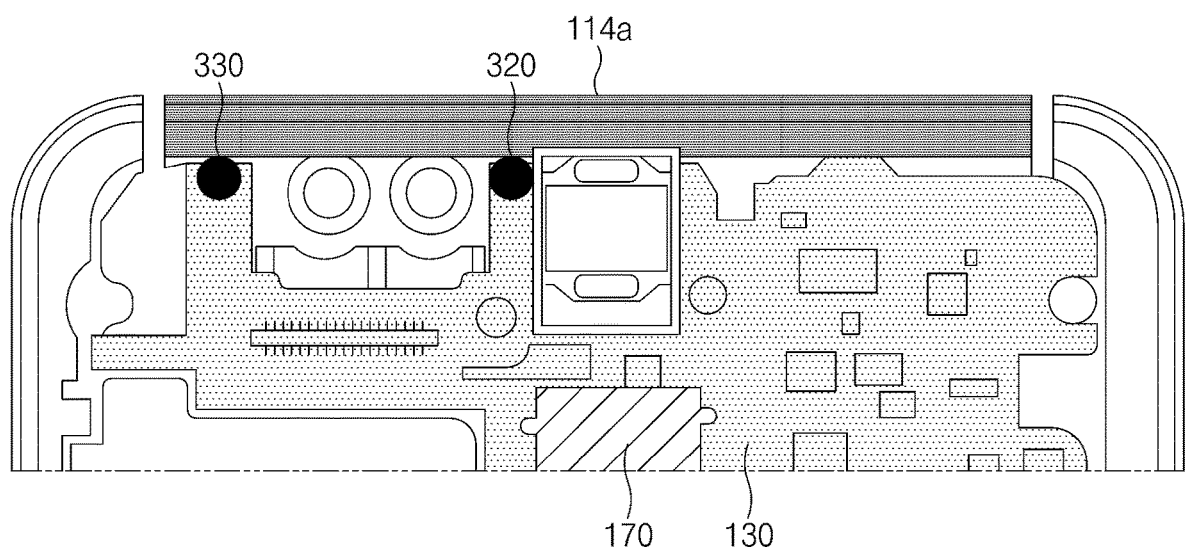
FIG. 3 is a diagram of a state where a second printed circuit board is attached to a side member, according to an embodiment.

FIG. 3 is a diagram of a state where a second PCB is attached to a side member, according to an embodiment.

Referring to FIG. 3, the antenna element 114a may be connected with a ground part 330. The antenna element 114a may be connected to the ground part 330 on the second PCB 130 through a wire. The ground part 330 may mean a portion of a ground layer included in the second PCB 130. A connection element (e.g., a C-clip) may be positioned on the ground part 330, and the connection element may connect the antenna element 114a and the wire.

The antenna element 114a may be connected with the wireless communication circuit 170. The antenna element 114a may be connected to a feed part 320 on the second PCB 130, and the feed part 320 may be connected with the wireless communication circuit 170 through a wire. The connection element (C-clip) may be positioned at the feed part 320, and the connection element may connect the antenna element 114a, the wire, and the wireless communication circuit 170.

When the antenna element 114a is electrically connected with the feed part 320, the wireless communication circuit 170 may supply a power to the antenna element 114a. When the wireless communication circuit 170 supplies a power to the antenna element 114a, the antenna element 114a and the first PCB 150 may be coupled. The wireless communication circuit 170 may be indirectly connected with the first PCB 150 through the antenna element 114a.

A width of the first PCB 150 may increase. As the width of the first PCB 150 increases, a contact area of the first PCB 150 and the support member 114b may increase, or a distance between the first PCB 150 and a ground area (e.g., a shield layer) of the display 120 may decrease. As the contact area of the first PCB 150 and the support member 114b increases or the distance between the first PCB 150 and the ground area of the display 120 decreases, a capacitance of the antenna 190 may increase, and a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the performance of radiation of the antenna 190 may be improved in the specified frequency band.

Figure 4:
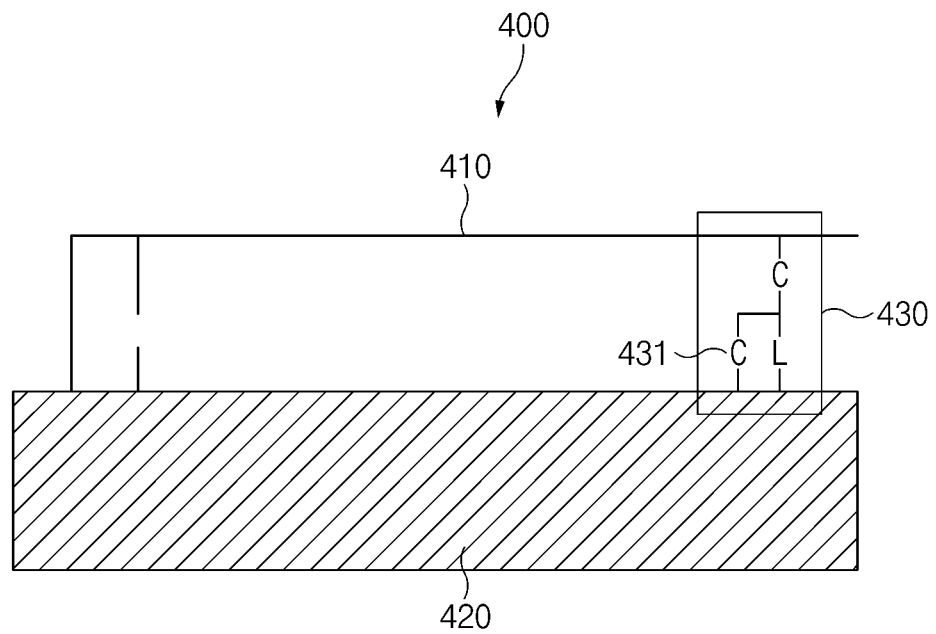
FIG. 4 is a diagram of an equivalent circuit of an antenna, according to an embodiment.

FIG. 4 is a diagram of an equivalent circuit of an antenna, according to an embodiment. An antenna 400 illustrated in FIG. 4 indicates an equivalent circuit of the antenna 190 illustrated in FIG. 1.

Referring to FIG. 4, the antenna 400 may include an antenna element 410, a support member 420, and a first PCB 430. The antenna element 410, the support member 420, and the first PCB 430 illustrated in FIG. 4 may respectively correspond to the antenna element 114a, the support member 114b, and the first PCB 150 illustrated in FIG. 1.

The wireless communication circuit 170 may supply a power to the antenna element 410. When the wireless communication circuit 170 supplies a power to the antenna element 410, the antenna element 410 and the first PCB 430 may be coupled, and the wireless communication circuit 170 may be indirectly connected with the first PCB 430 through the antenna element 410. As illustrated in FIG. 4, the first PCB 430 may perform functions of a capacitive element (e.g., a capacitor) and an inductive element (e.g., an inductor).

The ground part 150d illustrated in FIG. 2B may refer to a capacitive element 431. As the first PCB 430 includes the capacitive element 431, a capacitance of the antenna 400 may increase. As the capacitance of the antenna 400 increases, a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the performance of radiation of the antenna 400 may be improved in the specified frequency band.

Figure 5A:
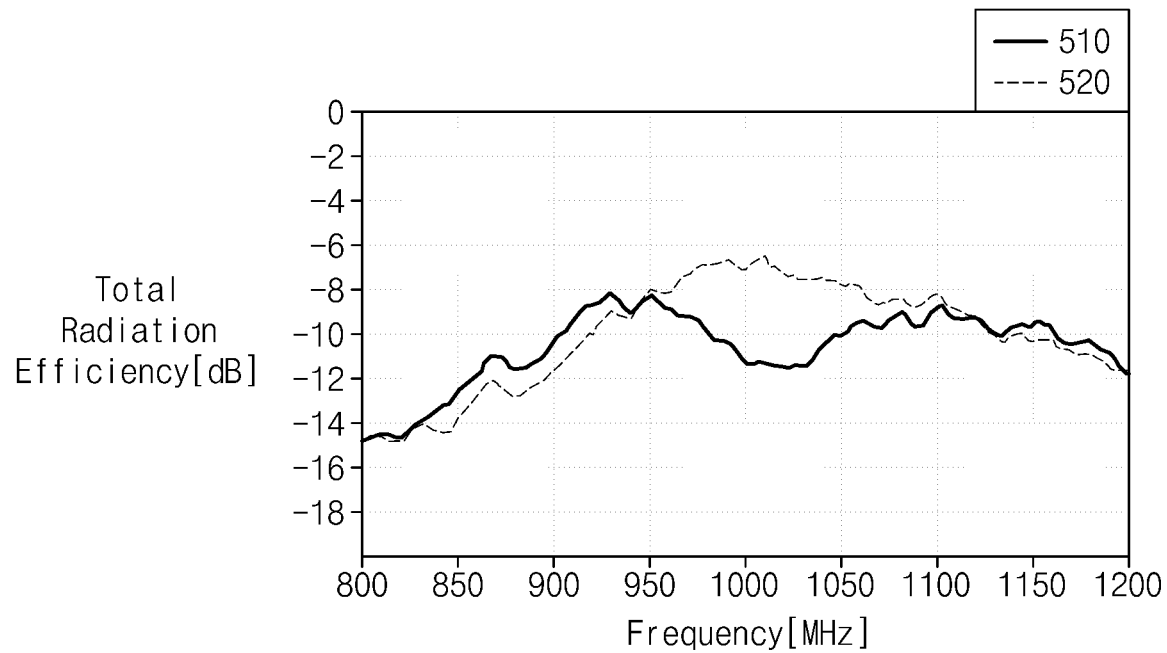
FIG. 5A is a diagram of a radiation efficiency of an antenna, according to an embodiment.
Figure 5B:
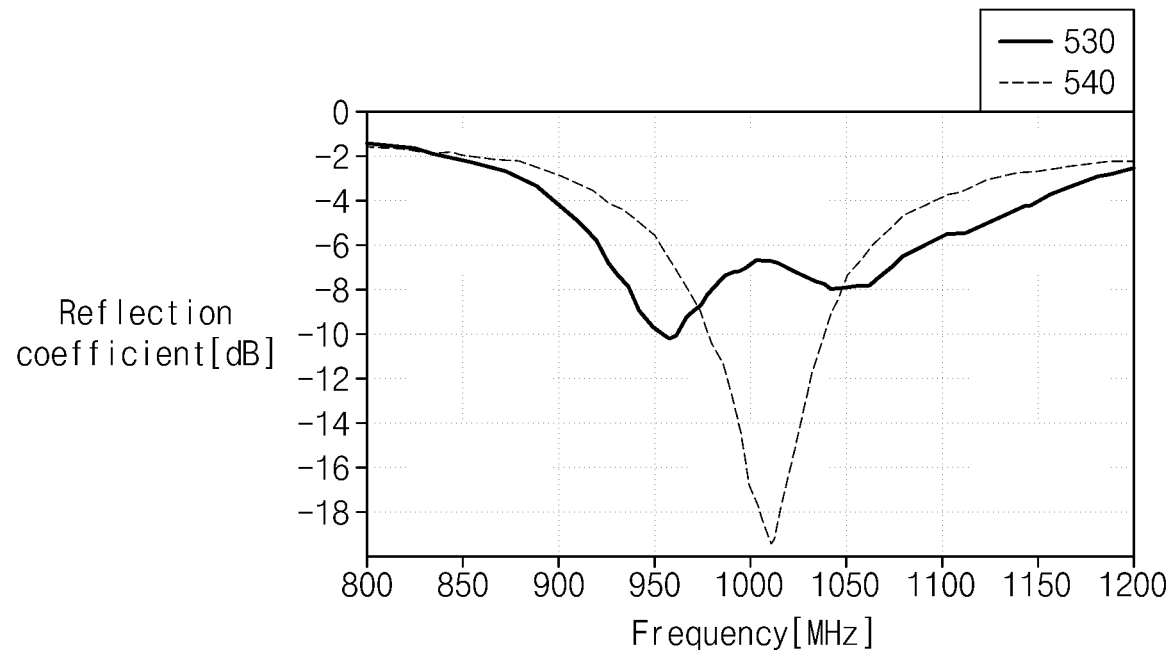
FIG. 5B is a diagram of a reflection coefficient of an antenna, according to an embodiment.

FIG. 5A is a diagram of radiation efficiency of an antenna, according to an embodiment. FIG. 5B is a diagram of a reflection coefficient of an antenna, according to an embodiment.

Referring to FIG. 5A, a first line 510 indicates a radiation efficiency of an electronic device according to a comparative example. A second line 520 illustrates a radiation efficiency of the electronic device 100. Comparing the first line 510 with the second line 520, in the case of the electronic device according to a comparative example, because a contact area of a first PCB and a support member is small, performance for signal transmission/reception in a specified frequency band (e.g., ranging from about 950 MHz to about 1050 MHz) may be somewhat low. However, a contact area of the first PCB 150 and the support member 114b may increase. Alternatively, as a width of the first PCB 150 increases, a distance between the first PCB 150 and an area (e.g., the support member 114b or a ground area of the display 120) capable of being using as a ground of the antenna 190 may decrease. As the contact area of the first PCB 150 and the support member 114b increases or the distance between the first PCB 150 and the area capable of being using as a ground of the antenna 190 decreases, a capacitance of the antenna 190 may increase. As the capacitance of the antenna 190 increases, a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the radiation efficiency of the antenna 190 in the specified frequency band may be improved.

Referring to FIG. 5B, a third line 530 indicates a reflection coefficient of an electronic device according to a comparative example. A fourth line 540 illustrates a reflection coefficient of the electronic device 100. Comparing the third line 530 with the fourth line 540, in the case of the electronic device according to a comparative example, because a contact area of a first PCB and a support member is small, a reflection coefficient in a specified frequency band (e.g., ranging from about 950 MHz to about 1050 MHz) may be somewhat high. However, a contact area of the first PCB 150 and the support member 114b may increase. Alternatively, as a width of the first PCB 150 increases, a distance between the first PCB 150 and an area (e.g., the support member 114b or a ground area of the display 120) capable of being using as a ground of the antenna 190 may decrease. As the contact area of the first PCB 150 and the support member 114b increases or the distance between the first PCB 150 and the area capable of being using as a ground of the antenna 190 decreases, a capacitance of the antenna 190 may increase. As the capacitance of the antenna 190 increases, a frequency of a parasitic resonance may gradually decrease (e.g., 800 MHz or lower). When the frequency of the parasitic resonance gradually decreases, the parasitic resonance may decrease in a specified frequency band (e.g., ranging from about 950 MHz to about 1050 MHz), and the reflection coefficient of the antenna 190 in the specified frequency band may be low.

Figure 6:
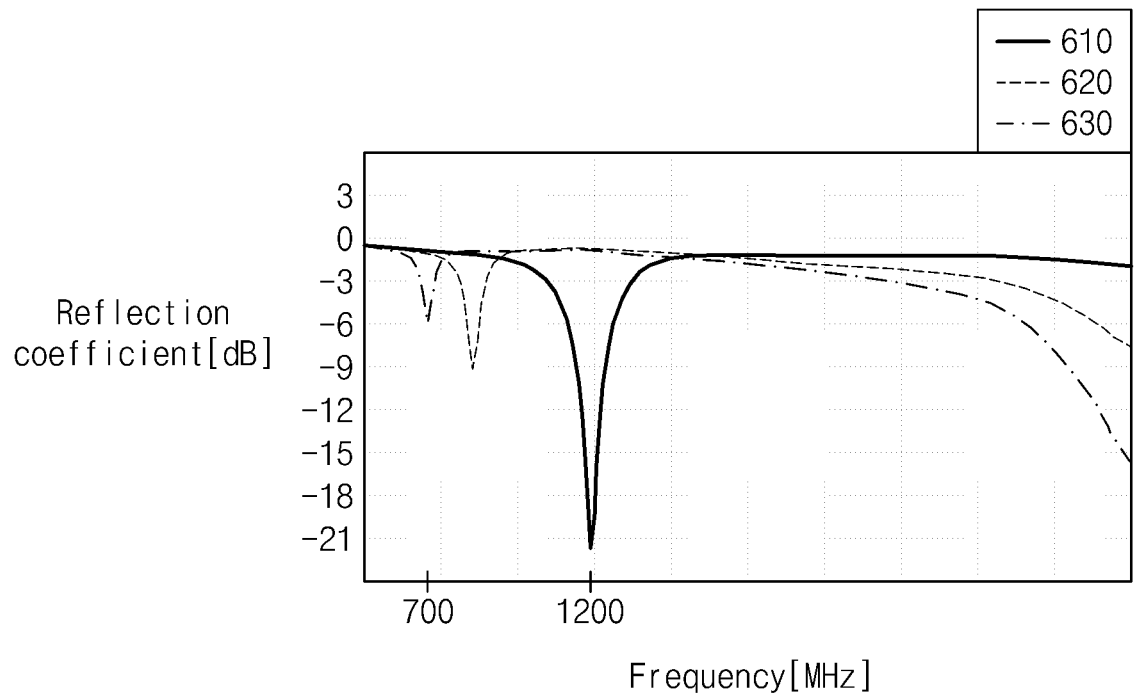
FIG. 6 is a diagram of a reflection coefficient of an antenna, according to an embodiment.

FIG. 6 is a diagram of a reflection coefficient of an antenna, according to an embodiment.

Referring to FIG. 6, line 610 indicates a parasitic resonance in the case where a contact area of the first PCB 150 and the support member 114b is small, line 620 indicates a parasitic resonance in the case where the contact area of the first PCB 150 and the support member 114b is greater than in the case of the line 610, and line 630 indicates a parasitic resonance in the case where the contact area of the first PCB 150 and the support member 114b is greater than in the case of line 620.

Line 610 indicates a parasitic resonance in the case where a distance between the first PCB 150 and an area (e.g., the support member 114b or a ground area of the display 120) capable of being used as a ground of the antenna 190 is great, line 620 indicates a parasitic resonance in the case where, as a width of the first PCB 150 increases, the distance between the first PCB 150 and the area capable of being used as a ground of the antenna 190 becomes shorter than in the case of line 610, and line 630 indicates a parasitic resonance in the case where, as the width of the first PCB 150 increases, the distance between the first PCB 150 and the area capable of being used as a ground of the antenna 190 becomes shorter than in the case of line 620.

Comparing line 610, line 620, and line 630, as the contact area of the first PCB 150 and the support member 114*b* increases, a frequency of a parasitic resonance may decrease. Alternatively, as the distance between the first PCB 150 and the area capable of being used as a ground of the antenna 190 deceases, a frequency of a parasitic resonance may decrease. As the contact area of the first PCB 150 and the support member 114*b* increases or the distance between the first PCB 150 and the area capable of being used as a ground of the antenna 190 decreases, a frequency of a parasitic resonance may decrease from about 1.2 GHz to about 700 MHz. As such, as the contact area of the first PCB 150 and the support member 114*b* increases or the distance between the first PCB 150 and the area capable of being used as a ground of the antenna 190 decreases, a parasitic resonance may not occur in a specified frequency band (e.g., ranging from about 950 MHz to about 1050 MHz).

Comparing line 610, line 620, and line 630, as the contact area of the first PCB 150 and the support member 114*b* increases or the distance between the first PCB 150 and the area capable of being used as a ground of the antenna 190 decreases, a magnitude of a parasitic resonance may decrease. As the contact area of the first PCB 150 and the support member 114*b* increases or the distance between the first PCB 150 and the area capable of being used as a ground of the antenna 190 decreases, the magnitude of the parasitic resonance may decrease from about −21 dB to about −6 dB. As such, as the contact area of the first PCB 150 and the support member 114*b* increases or the distance between the first PCB 150 and the area capable of being used as a ground of the antenna 190 decreases, the parasitic resonance may not occur in a specified frequency band (e.g., ranging from about 950 MHz to about 1050 MHz).

An electronic device according to an embodiment of the disclosure includes a cover glass, a back cover that faces away from the cover glass, a side member that surrounds a space between the cover glass and the back cover, at least a portion of the side member being formed of a conductive member, a support member that is extended from the side member, is interposed between the cover glass and the back cover, and includes at least one opening, a first PCB that is interposed between the support member and the back cover or between the support member and the cover glass, a second PCB that is interposed between the first PCB and the back cover or between the first PCB and the cover glass, an electrical component that overlaps the opening when viewed from above the cover glass and is positioned on the first PCB to be adjacent to the conductive member, and a wireless communication circuit that is positioned on the second PCB, is electrically connected with the conductive member, and transmits or receives a signal in a specified frequency band. The first PCB may at least partially overlap the support member when viewed from above the cover glass and includes a conductive layer, a first portion having a first width, and a second portion connecting the electrical component and the first portion, the second portion having a second width smaller than the first width.

The conductive member and the first PCB may be electrically connected by a coupling.

At least a portion of the first portion may be exposed through the opening when viewed from above the cover glass, and a remaining portion of the first portion overlaps the support member.

The first PCB may include at least one wire placed in the first portion and the second portion.

The wireless communication circuit may control the electrical component through the at least one wire.

The first PCB may include a plurality of layers, and the at least one wire may be placed in one of the plurality of layers.

The first portion may include at least one wire and the conductive layer.

The electrical component may include at least one of a proximity sensor and an illumination sensor.

The conductive member may be electrically connected with one point of the second PCB, and the wireless communication circuit may supply a power to the one point.

An electronic device may include a cover glass, a back cover that faces away from the cover glass, a side member that surrounding a space between the cover glass and the back cover, an antenna element that includes at least a portion of the side member, a support member that is extended from the side member and is interposed between the cover glass and the back cover, a first PCB that includes a first portion contacting the support member and a second portion not contacting the support member, a second PCB that is interposed between the first PCB and the back cover, a sensor that is positioned in the second portion, and a wireless communication circuit that is positioned on the second PCB and is electrically connected with the antenna element. A width of the first portion may be greater than a width of the second portion.

The wireless communication circuit may supply a power to the antenna element, and the antenna element and the first PCB may be electrically connected by a coupling.

The wireless communication circuit may transmit/receive a signal in a specified frequency band based on an electrical path formed through the antenna element and the first PCB.

The sensor may be exposed to an outside of the electronic device through an opening defined in the support member and the cover glass.

The first PCB may include at least one wire placed in the first portion and the second portion.

The wireless communication circuit may control the sensor through the at least one wire.

The first PCB may include a plurality of layers, and the at least one wire may be placed in one of the plurality of layers.

At least one of the plurality of layers may correspond to a conductive layer.

The first portion may include an area where the at least one wire is placed, and a remaining area other than the area where the at least one wire is placed, and the remaining area may include a conductive layer.

The sensor may include at least one of a proximity sensor and an illumination sensor.

An electronic device may include a housing that includes a first non-conductive plate, a second non-conductive plate facing away from the first non-conductive plate, and a side member surrounding a space between the first non-conductive plate and the second non-conductive plate, the side member including a first conductive portion, a second conductive portion, and a first insulating portion interposed between the first conductive portion and the second conductive portion, a conductive mid-plate that forms at least a portion of an opening together with the first conductive portion, the second conductive portion, and the first insulating portion when viewed from above the second non-conductive plate, and is extended from the second conductive portion of the side member within a space between the first non-conductive plate and the second non-conductive plate, a PCB that is positioned in the space and is parallel to the second non-conductive plate, a wireless communication circuit that is positioned on the PCB and is electrically connected with the first conductive portion, an electrical component that is positioned in the space and at least partially overlaps the opening, when viewed from above the second non-conductive plate, and an FPCB that includes a first portion overlapping the conductive mid-plate and a second portion overlapping the opening, when viewed from the second non-conductive plate. The FPCB may include at least one conductive line that is electrically connected with the electrical component, and a conductive plate that is formed in a part of the first portion and a part of the second portion. A conductive plate being in the part of the first portion may be spaced from the conductive mid-plate, may be parallel to the conductive mid-plate, and may be electrically isolated from the conductive line.

The electronic device may further include a ground member positioned in the space, and the conductive plate may be electrically connected with the ground member.

The ground member may be a portion of the PCB.

The electronic device may further include a polymeric material filling at least a portion of the opening.

The electronic device may further include a flexible conductive member that is interposed between the flexible PCB and the first conductive portion.

The electrical component may include at least one of a proximity sensor and an illumination sensor.

Figure 7:
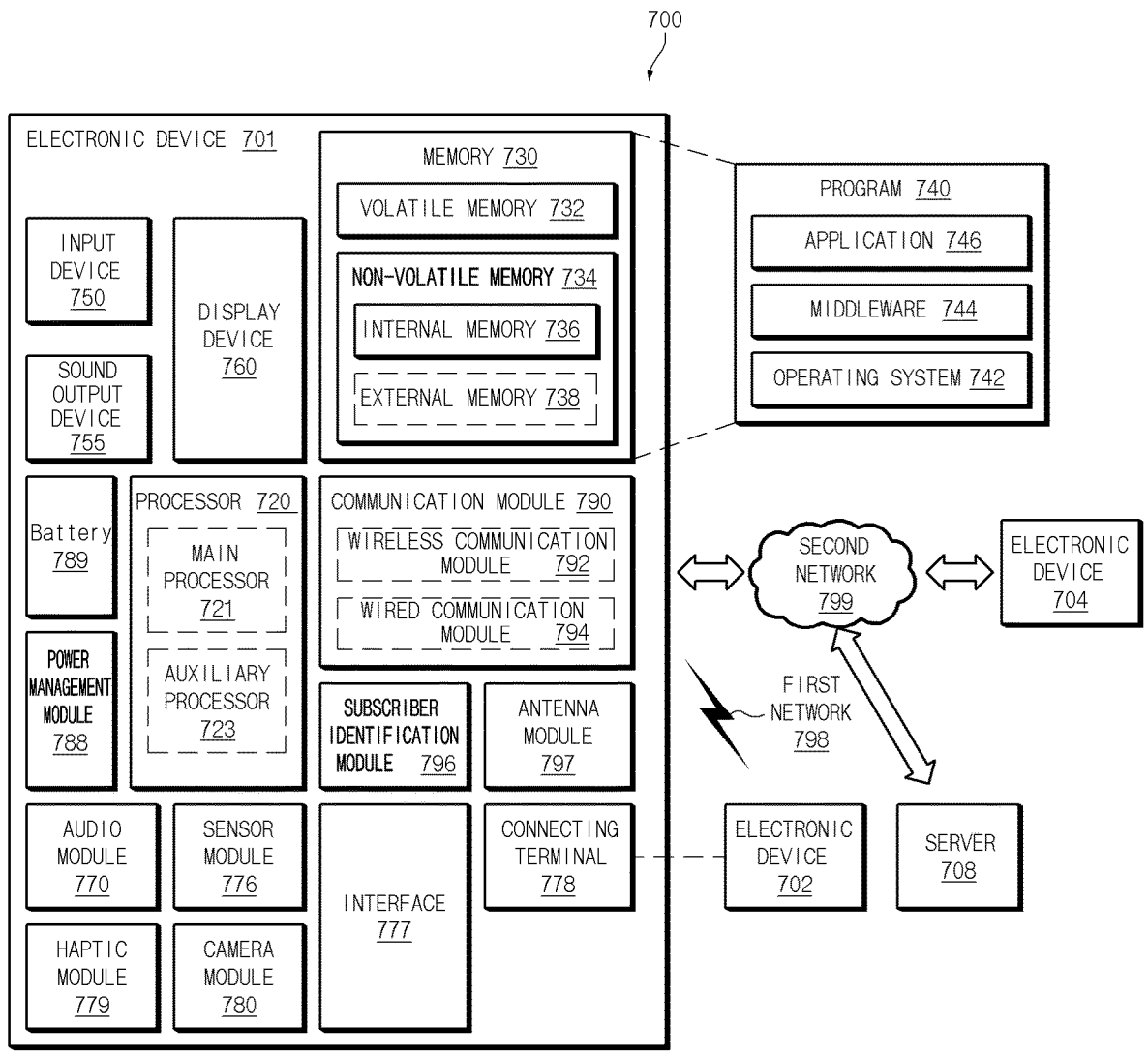
FIG. 7 is a diagram of an electronic device in a network environment, according to an embodiment.

FIG. 7 is a block diagram illustrating an electronic device 701 in a network environment 700 according to various embodiments. Referring to FIG. 7, the electronic device 701 in the network environment 700 may communicate with an electronic device 702 via a first network 798 (e.g., a short-range wireless communication network), or an electronic device 704 or a server 708 via a second network 799 (e.g., a long-range wireless communication network). According to an embodiment, the electronic device 701 may communicate with the electronic device 704 via the server 708. According to an embodiment, the electronic device 701 may include a processor 720, memory 730, an input device 750, a sound output device 755, a display device 760, an audio module 770, a sensor module 776, an interface 777, a haptic module 779, a camera module 780, a power management module 788, a battery 789, a communication module 790, a subscriber identification module (SIM) 796, or an antenna module 797. In some embodiments, at least one (e.g., the display device 760 or the camera module 780) of the components may be omitted from the electronic device 701, or one or more other components may be added in the electronic device 701. In some embodiments, some of the components may be implemented as single integrated circuitry. For example, the sensor module 776 (e.g., a fingerprint sensor, an iris sensor, or an illuminance sensor) may be implemented as embedded in the display device 760 (e.g., a display).

The processor 720 may execute, for example, software (e.g., a program 740) to control at least one other component (e.g., a hardware or software component) of the electronic device 701 coupled with the processor 720, and may perform various data processing or computation. According to one embodiment, as at least part of the data processing or computation, the processor 720 may load a command or data received from another component (e.g., the sensor module 776 or the communication module 790) in volatile memory 732, process the command or the data stored in the volatile memory 732, and store resulting data in non-volatile memory 734. According to an embodiment, the processor 720 may include a main processor 721 (e.g., a central processing unit (CPU) or an application processor (AP)), and an auxiliary processor 723 (e.g., a graphics processing unit (GPU), an image signal processor (ISP), a sensor hub processor, or a communication processor (CP)) that is operable independently from, or in conjunction with, the main processor 721. Additionally or alternatively, the auxiliary processor 723 may be adapted to consume less power than the main processor 721, or to be specific to a specified function. The auxiliary processor 723 may be implemented as separate from, or as part of the main processor 721.

The auxiliary processor 723 may control at least some of functions or states related to at least one component (e.g., the display device 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). According to an embodiment, the auxiliary processor 723 (e.g., an image signal processor or a communication processor) may be implemented as part of another component (e.g., the camera module 780 or the communication module 790) functionally related to the auxiliary processor 723.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input device 750 may receive a command or data to be used by other component (e.g., the processor 720) of the electronic device 701, from the outside (e.g., a user) of the electronic device 701. The input device 750 may include, for example, a microphone, a mouse, a keyboard, or a digital pen (e.g., a stylus pen).

The sound output device 755 may output sound signals to the outside of the electronic device 701. The sound output device 755 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 760 may visually provide information to the outside (e.g., a user) of the electronic device 701. The display device 760 may include, for example, a display, a hologram device, or a projector and control circuitry to control a corresponding one of the display, hologram device, and projector. According to an embodiment, the display device 760 may include touch circuitry adapted to detect a touch, or sensor circuitry (e.g., a pressure sensor) adapted to measure the intensity of force incurred by the touch.

The audio module 770 may convert a sound into an electrical signal and vice versa. According to an embodiment, the audio module 770 may obtain the sound via the input device 750, or output the sound via the sound output device 755 or a headphone of an external electronic device (e.g., an electronic device 702) directly (e.g., wiredly) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. According to an embodiment, the sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled with the external electronic device (e.g., the electronic device 702) directly (e.g., wiredly) or wirelessly. According to an embodiment, the interface 777 may include, for example, a high definition multimedia interface (HDMI), a universal serial bus (USB) interface, a secure digital (SD) card interface, or an audio interface.

A connecting terminal 778 may include a connector via which the electronic device 701 may be physically connected with the external electronic device (e.g., the electronic device 702). According to an embodiment, the connecting terminal 778 may include, for example, a HDMI connector, a USB connector, a SD card connector, or an audio connector (e.g., a headphone connector).

The haptic module 779 may convert an electrical signal into a mechanical stimulus (e.g., a vibration or a movement) or electrical stimulus which may be recognized by a user via his tactile sensation or kinesthetic sensation. According to an embodiment, the haptic module 779 may include, for example, a motor, a piezoelectric element, or an electric stimulator.

The camera module 780 may capture a still image or moving images. According to an embodiment, the camera module 780 may include one or more lenses, image sensors, image signal processors, or flashes.

The power management module 788 may manage power supplied to the electronic device 701. According to one embodiment, the power management module 788 may be implemented as at least part of, for example, a power management integrated circuit (PMIC).

The battery 789 may supply power to at least one component of the electronic device 701. According to an embodiment, the battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the application processor (AP)) and supports a direct (e.g., wired) communication or a wireless communication. According to an embodiment, the communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct, or infrared data association (IrDA)) or the second network 799 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The antenna module 797 may transmit or receive a signal or power to or from the outside (e.g., the external electronic device) of the electronic device 701. According to an embodiment, the antenna module 797 may include an antenna including a radiating element composed of a conductive material or a conductive pattern formed in or on a substrate (e.g., PCB). According to an embodiment, the antenna module 797 may include a plurality of antennas. In such a case, at least one antenna appropriate for a communication scheme used in the communication network, such as the first network 798 or the second network 799, may be selected, for example, by the communication module 790 (e.g., the wireless communication module 792) from the plurality of antennas. The signal or the power may then be transmitted or received between the communication module 790 and the external electronic device via the selected at least one antenna. According to an embodiment, another component (e.g., a radio frequency integrated circuit (RFIC)) other than the radiating element may be additionally formed as part of the antenna module 797.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 701 and the external electronic device 704 via the server 708 coupled with the second network 799. Each of the electronic devices 702 and 704 may be a device of a same type as, or a different type, from the electronic device 701. According to an embodiment, all or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance.

According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 740) including one or more instructions that are stored in a storage medium (e.g., internal memory 736 or external memory 738) that is readable by a machine (e.g., the electronic device 701). For example, a processor (e.g., the processor 720) of the machine (e.g., the electronic device 701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to embodiments of the disclosure, performance of an antenna may be improved. Also, according to embodiments of the disclosure, a parasitic resonance may be removed.

Besides, a variety of effects directly or indirectly understood through this disclosure may be provided.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a cover glass;
   a back cover facing away from the cover glass;
   a side member surrounding a space between the cover glass and the back cover, wherein at least a portion of the side member is formed of a conductive member;
   a support member extended from the side member, interposed between the cover glass and the back cover, and including at least one opening;
   a first printed circuit board interposed between the support member and the back cover or between the support member and the cover glass;
   a second printed circuit board interposed between the first printed circuit board and the back cover or between the first printed circuit board and the cover glass;
   an electrical component overlapping the opening when viewed from above the cover glass and positioned on the first printed circuit board to be adjacent to the conductive member; and
   a wireless communication circuit positioned on the second printed circuit board, electrically connected with the conductive member, and configured to transmit or receive a signal in a specified frequency band,
   wherein the first printed circuit board at least partially overlaps the support member when viewed from above, and
   wherein the first printed circuit board includes a conductive layer, a first portion having a first width, and a second portion connecting the electrical component and the first portion, the second portion having a second width smaller than the first width.

2. The electronic device of claim 1, wherein the conductive member and the first printed circuit board are electrically connected by a coupling.

3. The electronic device of claim 1, wherein at least a portion of the first portion is exposed through the opening when viewed from above the cover glass, and a remaining portion of the first portion overlaps the support member.

4. The electronic device of claim 1, wherein the first printed circuit board includes at least one wire placed in the first portion and the second portion.

5. The electronic device of claim 4, wherein the wireless communication circuit is further configured to control the electrical component through the at least one wire.

6. The electronic device of claim 4, wherein the first printed circuit board includes a plurality of layers, and
wherein the at least one wire is placed in one of the plurality of layers.

7. The electronic device of claim 4, wherein the first portion includes at least one wire and the conductive layer.

8. The electronic device of claim 1, wherein the electrical component includes at least one of a proximity sensor and an illumination sensor.

9. The electronic device of claim 1, wherein the conductive member is electrically connected with one point of the second printed circuit board, and
wherein the wireless communication circuit supplies a power to the one point.

10. An electronic device comprising:
a cover glass;
a back cover facing away from the cover glass;
a side member surrounding a space between the cover glass and the back cover;
an antenna element including at least a portion of the side member;
a support member extended from the side member and interposed between the cover glass and the back cover;
a first printed circuit board including a first portion contacting the support member and a second portion not contacting the support member;
a second printed circuit board interposed between the first printed circuit board and the back cover;
a sensor positioned in the second portion; and
a wireless communication circuit positioned on the second printed circuit board and electrically connected with the antenna element,
wherein a width of the first portion is greater than a width of the second portion.

11. The electronic device of claim 10, wherein the wireless communication circuit supplies a power to the antenna element, and
wherein the antenna element and the first printed circuit board are electrically connected by a coupling.

12. The electronic device of claim 10, wherein the wireless communication circuit transmits or receives a signal in a specified frequency band based on an electrical path formed through the antenna element and the first printed circuit board.

13. The electronic device of claim 10, wherein the sensor is exposed to an outside of the electronic device through an opening defined in the support member and the cover glass.

14. The electronic device of claim 10, wherein the first printed circuit board includes at least one wire placed in the first portion and the second portion.

15. The electronic device of claim 14, wherein the wireless communication circuit is configured to control the sensor through the at least one wire.

16. The electronic device of claim 14, wherein the first printed circuit board includes a plurality of layers, and
wherein the at least one wire is placed in one of the plurality of layers.

17. The electronic device of claim 14, wherein at least one of the plurality of layers corresponds to a conductive layer.

18. The electronic device of claim 14, wherein the first portion includes an area where the at least one wire is placed, and a remaining area other than the area where the at least one wire is placed, and
wherein the remaining area includes a conductive layer.

19. The electronic device of claim 10, wherein the sensor includes at least one of a proximity sensor and an illumination sensor.

20. An electronic device comprising:
a housing including a first non-conductive plate, a second non-conductive plate facing away from the first non-conductive plate, and a side member surrounding a space between the first non-conductive plate and the second non-conductive plate, wherein the side member includes:
a first conductive portion;
a second conductive portion; and
a first insulating portion interposed between the first conductive portion and the second conductive portion;
a conductive mid-plate forming at least a portion of an opening together with the first conductive portion, the second conductive portion, and the first insulating portion when viewed from above the second non-conductive plate, and extended from the second conductive portion of the side member within a space between the first non-conductive plate and the second non-conductive plate;
a printed circuit board positioned in the space and parallel to the second non-conductive plate;
a wireless communication circuit positioned on the printed circuit board and electrically connected with the first conductive portion;
an electrical component positioned in the space, and at least partially overlapping the opening when viewed from above the second non-conductive plate; and
a flexible printed circuit board including a first portion overlapping the conductive mid-plate and a second portion overlapping the opening when viewed from the second non-conductive plate, wherein the flexible printed circuit board includes:
at least one conductive line electrically connected with the electrical component; and
a conductive plate formed in a part of the first portion and a part of the second portion,
wherein a conductive plate in the part of the first portion is spaced from the conductive mid-plate is parallel to the conductive mid-plate and is electrically isolated from the conductive line.

* * * * *